United States Patent [19]

Gibbons, Jr. et al.

[11] Patent Number: 5,046,425

[45] Date of Patent: Sep. 10, 1991

[54] MANUFACTURE OF EXPLOSIVE CIRCUITS USING SILK SCREENING TECHNIQUES AND EXPLOSIVE INKS

[75] Inventors: Gould Gibbons, Jr., Finksburg, Md.; Denis A. Silvia, Corpus Christi, Tex.

[73] Assignee: The United States of America as represented by the Secretary of the Army, Washington, D.C.

[21] Appl. No.: 607,433

[22] Filed: Oct. 23, 1990

[51] Int. Cl.⁵ ............................................. F42C 19/00
[52] U.S. Cl. .................................... 102/293; 102/200; 102/275.9
[58] Field of Search ...................... 102/200, 275.9, 293

[56] References Cited

U.S. PATENT DOCUMENTS

| | | | |
|---|---|---|---|
| H143 | 10/1986 | Blische | 86/20 R |
| H207 | 2/1987 | Silvia et al. | 102/275.9 |
| 3,430,564 | 3/1969 | Silvia et al. | 102/275.9 |
| 3,496,868 | 2/1970 | Silvia et al. | 102/200 |
| 3,728,965 | 4/1973 | Silvia | 102/275.9 |
| 3,768,409 | 10/1973 | Menz et al. | 102/275.9 |
| 3,973,499 | 8/1976 | Anderson et al. | 102/200 |
| 4,412,493 | 11/1983 | Silvia | 102/275.9 |
| 4,521,260 | 6/1985 | Johnson et al. | 149/19.91 |

*Primary Examiner*—Charles T. Jordan
*Attorney, Agent, or Firm*—Saul Elbaum; Freda L. Krosnick

[57] ABSTRACT

A method for manufacturing explosive logic circuit trails using conventional silk screening techniques. Silk screening is used to build up both the explosive trail, as well as the inert substrate. This is accomplished one layer at a time onto a circuit base material. The explosive logic circuit herein is reliable, cost efficient and relatively easy to produce. The invention herein encompasses both the method of manufacturing said explosive logic circuits and the circuits themselves.

12 Claims, No Drawings

MANUFACTURE OF EXPLOSIVE CIRCUITS USING SILK SCREENING TECHNIQUES AND EXPLOSIVE INKS

RIGHTS OF THE GOVERNMENT

The invention described herein may be manufactured, used and licensed by or for the U.S. Government for governmental purposes without the payment to us of any royalties thereon.

BACKGROUND OF THE INVENTION

The present invention relates to a manufacturing technique for the manufacture of explosive circuits and it further relates to the product obtained by said process. Explosive circuits are generally used in multi-point initiation and explosive logic devices. These explosive circuits are often referred to as explosive trail networks, explosive circuit trails, and explosive logic circuits.

Explosive circuit trails are widely used for the initiation of various, sophisticated warheads. Circuit trails are generally composed of inert substrates having at least one continuous channel which is filled with conventional explosives. The substrate material conventionally used have been composed of inert materials, such as metals or plastics. Although metal substrates are more efficient than plastic substrates in promoting detonation in small trails, the use of metal does not allow one to examine and inspect the channels therein once the explosive is loaded into them. Therefore, the utilization of clear plastic substrates became popular.

In an explosive circuit, the substrate material encases or covers the explosive material so that the explosive is never exposed to the environment. The explosive circuits which are presently available are costly to manufacture and they must be machined or molded with great precision in order to be rendered operable. The channels or trails, which are to be filled with explosives, are molded or machined with excruciating effort. These channels are then, ordinarily, hand loaded with a putty-like explosive. Hand loading has been shown to be inadequate to insure consistent performance of the logic circuits. The explosives must be uniformly and consistently loaded into the channels to provided proper initiation of the warheads. If a void or imperfection exists in the explosive trail, it often results in failure of the explosive circuit. Any flaw, such as pieces of dust or chips of substrate present in the explosive trail from the machining of the substrate may interrupt the detonation path, and therefore rendering the entire warhead a failure.

As previously described, in the prior art explosive circuits, the inert substrates are composed of optically transparent materials so that the explosive trails may be thoroughly inspected. Prior to this invention there were no alternative ways in which to adequately inspect the explosive trails therein.

Explosive logic networks are generally taught in U.S. Pat. Nos. 4,412,493 (Silvia) and 3,973,499 (to Anderson et al.). Neither U.S. patent suggests the use of silk-screening in the manufacture of said networks.

There is much waste in explosives used in the circuits already available. For example a putty-like explosive, such as PBXN-301 (manufactured by The Ensign-Brickford Company, Simsbury, Connecticut), which is extremely expensive may be loaded into the channels of the circuit by the use of vacuum-pressure. Vacuum-pressure is used to load the circuit to assure that the explosive trail network is correctly filled without voids. The likelihood of improper loading using this method is great, which is consequently costly to the manufacturer.

Use of the present invention enables one to utilize an inexpensive, efficient and accurate means of manufacturing an explosive circuit. Although explosive circuit trails are well known in the art, the method of making and the improved circuits produced using these methods is neither known nor suggested by the prior art.

BRIEF SUMMARY OF THE INVENTION

This invention deals with a method for manufacturing explosive logic circuit trails and the improved product produced by said method. The invention is manufactured using conventional silk screening techniques. Silk screening is used herein to build up both the explosive trail, as well as the inert substrate. A chief advantage of the use of silk screening in the present invention is that one can build up the substrate and explosive trail layer by layer, thus allowing one to inspect the trails at each layer. The explosive logic circuit trails herein are, therefore, reliable, cost efficient and relatively easy to produce.

Unlike the prior art explosive logic circuit trails, the present invention is not limited to the use of optically transparent materials for its substrate. This is not necessary in that each silk screened layer of the explosive logic circuit trail may be easily and readily inspected as it is cured. This increases the reliability of the product produced.

It is an object of the present invention to create an improved method for manufacturing explosive logic circuit trails.

It is a further object of the invention to produce a reliable explosive logic circuit trail.

It is a further object of the present invention to produce a reliable explosive logic circuit trail by use of conventional silk screening techniques.

It is a further object of the invention to produce an explosive logic circuit trail using inexpensive means.

It is a further object of the invention to produce an explosive logic circuit trail which may be readily inspected for voids in the explosive trail.

It is a further object of the invention to produce an explosive logic circuit trail which may be easily and thoroughly inspected during its production.

Yet another object of the invention is to produce an explosive logic circuit trail which may be accurately reproduced.

Other objectives and features of the present invention will be apparent from the following detailed description of the invention and claims.

DETAILED DESCRIPTION OF THE INVENTION

The invention encompasses a process of manufacturing explosive logic circuit trails and multi-point initiation trails and the product produced by said process. The novelty of the present invention does not reside in the specific configuration of the explosive trails; rather, it resides in the method of making them. The process makes use of conventional silk screening technology to simultaneously build up both the explosive trail component and the inert substrate one layer at a time onto a circuit base material. Silk screening is a mature technology, commonly used in printing signs, and newspapers. It is also used for decorating glassware, tableware, and clothing.

The method claimed herein will replace the present method of manufacturing circuit trails which has been by use of an expensive process for machining and loading said devices. (This prior art method is touched on, for example, at column 3, lines 1-6 of U.S. Pat. No. 3,973,499.) By exercising the present invention, the explosive logic circuit trails produced may be inspected and certified at each individual step, or layer, of the production process. This would increase the reliablility of the product and reduce the incident of error and, consequently, waste.

The parameters required to develop an explosive logic circuit within the scope of the present invention are dictated by the need of the user to produce, for example, a safe rocket motor igniter using an explosive logic network circuit. The user's need may relate to producing a fail safe apparatus for use in the initiation of a rocket motor ignitor or a high explosive warhead. More specifically, the invention herein deals with a device that will not initiate an unintended or unexpected firing signal. How the parameters may be developed and chosen to accomplish the need of the user are described in Anderson et al., U.S. Pat. No. 3,973,499. Moreover, said reference illustrates an exemplary design of explosive logic networks. The teachings of Anderson et al. are hereby incorporated by reference for this purpose and to illustrate well-known explosive logic circuit configurations.

The explosive logic circuit trail within the scope of the present invention is first designed graphically. It is designed and tailored in such a fashion so as to accommodate the specific needs of the user. It is designed to achieve the required reaction rate needed. The graphic design is then transferred to a silk screen plate. The silk screen plate is produced by conventional means by using a photographic emulsion to develop the screen image. The thickness of the photographic emulsion layer and the screen mesh size will dictate the thickness of the applied component mixture—i.e., the explosive or the inert substrate. Both the explosive pattern as well as the substrate pattern are transferred to the screens in the same conventional manner. Note that the conventional technology of silk screening, such as, mask manufacture, automatic drying and inking are used.

In the present invention, two types of ink are involved in the process claimed. The first ink consists of an inert material which may or may not be in a volatile solvent. Among the types of inert materials which may be used in the present invention are acrylic, vinyl, polyester, or epoxy ink bases, and the like. This first ink would make up the substrate of the explosive logic circuit trail herein. It will also be present and silk-screened throughout the explosive logic circuit except where the explosive is found.

The second ink is composed of any conventional explosive suspended in a volatile solvent. The user elects the use of certain explosive inks in order to accommodate his needs for a specific, required reaction rate for a given trail circuit. Different explosives have different detonation velocities. For example, HMX (cyclotetramethylene tetranitramine) detonates at 9,100 m/s; PETN (pentaerythritol tetranitrate) detonates at 8,400 m/s; and TETRYL (trinitro-2,4,6-phenylmethylnitramine) detonates at 7,570 m/s. Moreover, one practicing the present invention may blend explosives having different detonation velocities in order to produce an explosive with a detonation velocity different than that of the individual components. To illustrate this blending technique, a composition may be produced by blending 40% wt. TNT (trinitrotoluene) which has a detonation velocity of 6,900 m/s with 60% wt. RDX, which has a detonation velocity of 8,750 m/s. The resulting blend produces a composition having a detonation velocity of 7,800 m/s.

Any conventional explosive may be used and be within the scope of the present invention so long as the purpose of the user is met. The inks may additionally contain other conventional ingredients, such as ink bases or resins. The conventional ingredients may be either inert or reactive substances.

The first ink occupies the substrate portion of the logic circuit; whereas, the second ink, the explosive ink, will occupy the trail component of the circuit. Each ink is silk screened separately and is then cured in an alternating fashion, one layer at a time. The silk screening is exercised on a circuit base made up of a suitable material, such as fiberglass or the like.

Choice of circuit base materials depends upon the type of ink employed and the structural requirements of the weapon system in which the explosive logic circuit is to be used. Chemical adhesion between the inks and the circuit base material plays a major role in the selection of the proper base material.

The explosive circuit trail, after being applied to the circuit base material, and after being cured, is thoroughly inspected. The explosive circuit is inspected after each layer is screened onto the base. The final silk screened explosive ink layer may have a total thickness ranging from about 0.025 inch to about 0.040 inch. Once the final explosive layer is applied, the explosive logic circuit trail is protected by an inert covering. Said covering may be composed of any lacquer, a cover plate, a combination of the two, or materials having like properties. Any chemically suitable lacquer (i.e., cellulose esters, cellulose ethers, etc.) may be used herein. Moreover, the cover plates may be composed of steel, aluminum or a polymer base which would serve the particular purpose needed.

The protective covering serves the purpose of protecting the circuit trail from accidental ignition or external contamination. For example, the protective covering may be designed to protect the circuit against heat, impact and electrical discharge.

Generally, the use of the circuitry of the present invention with a rocket motor, for example, provides a predetermined sequence of signals to cause the initiation of said rocket motor. Accidental firing of the rocket motor is reduced, if not prevented, due to the low probability that the exact sequence of signals required to initiate the rocket motor would be introduced to fire the detonators in the explosive logic circuit.

For illustration purposes, the invention may be exercised by following the enumerated steps set forth below:

(1) The user must create and develop a graphic representation of the logic circuit which would accommodate his particular needs. This may be done in the conventional manner identified and well-known in the prior art. He would create a design for the explosive ink to fill. This would be accomplished by determining the required reaction rates of different trails which may be silk screened in the circuit. The user would then develop an explosive ink which would match the required reaction rate for the given circuit trail. The applied explosive film thickness needed to accurately reproduce the desired reaction rate would then be calculated.

(2) The user then creates a graphic representation for the inert substrate ink which will be utilized. This design is such as to compliment the explosive circuit trail.

(3) Using conventional silk screening techniques, the user then prepares silk screens of the explosive trail and inert substrate.

(4) The silk screens are produced in the conventional fashion by matching film thickness requirements with the choice of screen mesh and number of emulsion layers needed.

(5) The user is then ready to apply the inert substrate design to the circuit base. Said inert substrate design, after being silk screened, is cured and inspected for any flaws or cracks.

(6) Once the substrate layer is cured, the explosive trail design of a specific reaction rate is applied thereto, cured and inspected for voids.

(7) A second explosive trail design of possibly a different reaction rate may then be applied, cured and inspected.

(8) The above process steps are repeated until the desired explosive logic circuit trail is complete.

(9) A protective covering is then applied to the completed, resulting explosive logic circuit trail.

The step-by-step description above is merely illustrative of the method in which the present invention may be exercised. The novelty of the present invention resides in the use of silkscreening technology to produce a safe explosive logic circuit. It will be obvious to those skilled in the explosive logic circuit art that changes and modifications may be made to the claimed method without departing from the spirit of the present invention.

EXAMPLE

The above-outlined process of making an explosive logic circuit trail within the scope of the present invention may be followed using an explosive ink base composition containing, as an example for discussion only, the following materials in dry weight:

PETN (explosive ink): 80% by weight.
Organic Ink Base (Rex 780$^R$): 20% by weight.

Rex 780$^R$, a non-reactive ink base, is supplied by Advance Process, Chicago, Illinois. A conventional, reactive base polymer may be used as the organic ink base without departing from the scope of the present invention. As a matter of fact use of a conventional, reactive base polymer may be the preferred approach. To the above dry ink base composition, a solvent, such as methyl ethyl ketone, is added to obtain the desired ink consistency. Methyl ethyl ketone, for example, may be added in amounts to produce an ink whose total composition comprises from 10-20% wt. of said solvent.

. Many other conventional explosive inks may be used in the present invention provided they meet the reaction rate requirements of the designer of said circuit. Explosive inks may even be custom blended to meet the requirements of the circuit design.

Although the invention has been described with reference to a specific embodiment, it is to be understood that the invention herein is not limited to said precise embodiment. Various changes and modifications may be effected by one skilled in the art without departing from the scope or spirit of the present invention.

We claim:

1. A method for manufacturing explosive logic circuits comprising:
   developing a graphic representation of the logic circuit based on required reaction rates;
   developing an explosive ink composition which would satisfy the reaction rate required;
   calculating the film thickness needed of said explosive ink to satisfy the reaction rate;
   developing an inert substrate ink;
   producing silk screens of the explosive trail and inert substrate;
   silk screening the inert substrate design using said inert substrate ink onto a base;
   curing said inert substrate design;
   inspecting said design for voids;
   silk screening the explosive trail design using said explosive ink composition;
   curing said explosive trail design;
   inspecting said design for voids;
   repeating the steps until the circuit is complete; and
   applying a protective covering to said complete explosive logic circuit.

2. The method in accordance with claim 1, wherein said inert substrate ink comprises acrylic, vinyl, polyester or epoxy ink bases.

3. The method in accordance with claim 1, wherein the explosive ink may comprise PETN, HMX, or TETRYL.

4. The method in accordance with claim 3, wherein the explosive ink comprises 80% wt. PETN and 20% wt. of an organic ink base.

5. The method in accordance with claim 1, wherein said protective covering is a lacquer or a cover plate.

6. An explosive logic circuit produced in accordance with claims 1, 2, 3, 4 or 5.

7. A method for manufacturing an explosive logic circuit comprising the following steps of
   silk screening an inert substrate ink onto a base material;
   curing said inert substrate ink;
   inspecting said cured inert substrate ink for flaws;
   silk screening an explosive ink composition onto said base material;
   curing said explosive ink composition;
   inspecting said cured explosive ink composition for voids;
   repeating these steps until the circuit is complete; and
   applying a protective covering onto said completed explosive logic circuit.

8. The method in accordance with claim 7, wherein said inert substrate ink comprises acrylic, vinyl, polyester or epoxy ink bases.

9. The method in accordance with claim 7, wherein said explosive ink comprises PETN, HMX or TETRYL.

10. The method in accordance with claim 9, wherein the explosive ink composition comprises 80% wt. PETN and 20% wt. of an organic ink base.

11. The method in accordance with claim 7, wherein said protective covering is a lacquer or a cover plate.

12. An explosive logic circuit produced in accordance with claims 7, 8, 9, 10 or 11.

* * * * *